(12) United States Patent
Wu

(10) Patent No.: US 7,456,694 B2
(45) Date of Patent: Nov. 25, 2008

(54) SELF-CALIBRATED CONSTANT-GAIN TUNABLE OSCILLATOR

(75) Inventor: Hai Jie Wu, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/558,011

(22) PCT Filed: May 30, 2003

(86) PCT No.: PCT/SG03/00135

§ 371 (c)(1),
(2), (4) Date: Nov. 22, 2005

(87) PCT Pub. No.: WO2004/107582

PCT Pub. Date: Dec. 9, 2004

(65) Prior Publication Data

US 2006/0255862 A1   Nov. 16, 2006

(51) Int. Cl.
*H03L 7/00* (2006.01)
(52) U.S. Cl. .............................. 331/16; 331/11; 331/44
(58) Field of Classification Search .................. 331/16, 331/17, 11, 44
See application file for complete search history.

(56) References Cited

U.S. PATENT DOCUMENTS

| | | | | |
|---|---|---|---|---|
| 4,791,346 A | * | 12/1988 | Kahkipuro | .................. 318/805 |
| 5,237,365 A | * | 8/1993 | Miyazawa | .................... 396/49 |
| 5,382,922 A | | 1/1995 | Gersbach et al. | |
| 5,406,481 A | * | 4/1995 | Shinozawa et al. | ............. 702/3 |
| 6,552,618 B2 | * | 4/2003 | Nelson et al. | .................. 331/11 |
| 6,686,804 B1 | * | 2/2004 | Adams et al. | .................. 331/17 |
| 6,870,411 B2 | * | 3/2005 | Shibahara et al. | ........... 327/156 |
| 2003/0042985 A1 | | 3/2003 | Shibahara et al. | |

FOREIGN PATENT DOCUMENTS

JP        2003078410        3/2003

\* cited by examiner

*Primary Examiner*—Robert J. Pascal
*Assistant Examiner*—Levi Gannon
(74) *Attorney, Agent, or Firm*—Maginot, Moore & Beck

(57) ABSTRACT

The present invention provides a tunable oscillator. A voltage-to-current converter receives as input a voltage from a phase-locked loop and outputs a first current. A current-controlled oscillator receives the first current and outputs a frequency responsive to the voltage. A second current is input into the current-controlled oscillator to adjust the gain of the current-controlled oscillator. A third current is input into the voltage-to-current converter to adjust the first current and the gain of the voltage-to-current converter. The second and third current values are set using a two-stage pre-calibration method. During the pre-calibration, a control circuit adjusts and then sets the second and third currents so that the output frequency spans a lock-in frequency range required by the phase-locked-loop over a voltage range spanning voltage tolerance of a loop capacitor of the phase-locked-loop.

14 Claims, 3 Drawing Sheets

SELF-CALIBRATED CONSTANT-GAIN TUNABLE OSCILLATOR

FIELD OF THE INVENTION

The present invention relates to tunable oscillators and, more particularly, to the self-calibration of tunable oscillators to produce constant gain over a wide tuning range.

BACKGROUND OF THE INVENTION

Voltage-controlled-oscillators (VCOs) are often used as the frequency source for phase-locked-loops (PLLs) when implementing frequency synthesizers. However, it is difficult to make the PLLs stable over a wide tuning range (e.g. from 500 MHz to 1 GHz) for locking onto external signals. Most of the dynamic range on the loop capacitor (for supplying the voltage input to the VCO) is wasted because of the process and temperature variation of the CMOS process. The voltage required by the loop capacitor can go to very high levels under certain process and temperatures such as those in the C11 (0.12 micrometer) and L90 (0.09 micrometer) processes, which can cause severe leakage problems.

It would be desirable to have a tunable oscillator such as a VCO which has a relatively constant gain over a broad frequency range and is immune to power supply, process and temperature variation.

SUMMARY OF THE INVENTION

The present invention utilizes a voltage-to-current converter in combination with a current-controlled oscillator to form a VCO. The gain of the voltage-to-current converter changes with the gain of the current-controlled oscillator to form a VCO having an overall constant gain. With such constant VCO gain, it is much easier to make the PLL stable over a wide frequency tuning range. Also, maximum dynamic range can be achieved under all conditions, improving the jitter performance of the VCO. Also, the voltage range to be used on the loop capacitor is well defined, helping avoid leakage problems when a capacitor such as a single gate q-capacitor is used. This prevents the voltage on the loop capacitor from reaching high values when C11 or L90 processes are used.

The present invention provides a tunable oscillator. A voltage-to-current converter receives as input a voltage from a phase-locked loop and outputs a first current. A current-controlled oscillator receives the first current and outputs a frequency responsive to the voltage. A second current is input into the current-controlled oscillator to adjust the gain of the current-controlled oscillator. A third current is input into the voltage-to-current converter to adjust the first current and the gain of the voltage-to-current converter. The second and third current values are set using a two-stage pre-calibration method. During the pre-calibration, a control circuit adjusts and then sets the second and third currents so that the output frequency spans a lock-in frequency range required by the phase-locked-loop over a voltage range spanning voltage tolerance of a loop capacitor of the phase-locked-loop.

In general terms, the invention is for a tunable oscillator comprising a voltage-to-current converter having an input for receiving a voltage from a phase-locked loop and an output for outputting a first current converted from the voltage. A current-controlled oscillator has an input for receiving the first current and an output for outputting an output frequency responsive to the voltage. A second current is input into the current-controlled oscillator for adjusting the gain of the current-controlled oscillator. A third current is input into the voltage-to-current converter for adjusting the first current and the gain of the voltage-to-current converter. A control circuit adjusts the second and third currents so that the output frequency spans a lock-in frequency range required by the phase-locked loop.

The method for calibrating a tunable oscillator comprises the steps of supplying a first voltage to a voltage-to-current converter to produce a first control current from the voltage-to-current converter; supplying the first control current to a current-controlled-oscillator to produce a first frequency; comparing the first frequency to a lower frequency of the lock-in frequency range required by a phase-locked loop; adjusting a first calibration current input into the current-controlled-oscillator to adjust the first frequency to approximately the lower frequency; supplying a second voltage to the voltage-to-current converter to produce a second control current from the voltage-to-current converter; supplying the second control current to the current-controlled-oscillator to produce a second frequency; comparing the second frequency to an upper frequency of the lock-in frequency range required by a phase-locked loop; and adjusting a second calibration current input into the voltage-to-current converter to adjust the second frequency to approximately the upper frequency.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 1:
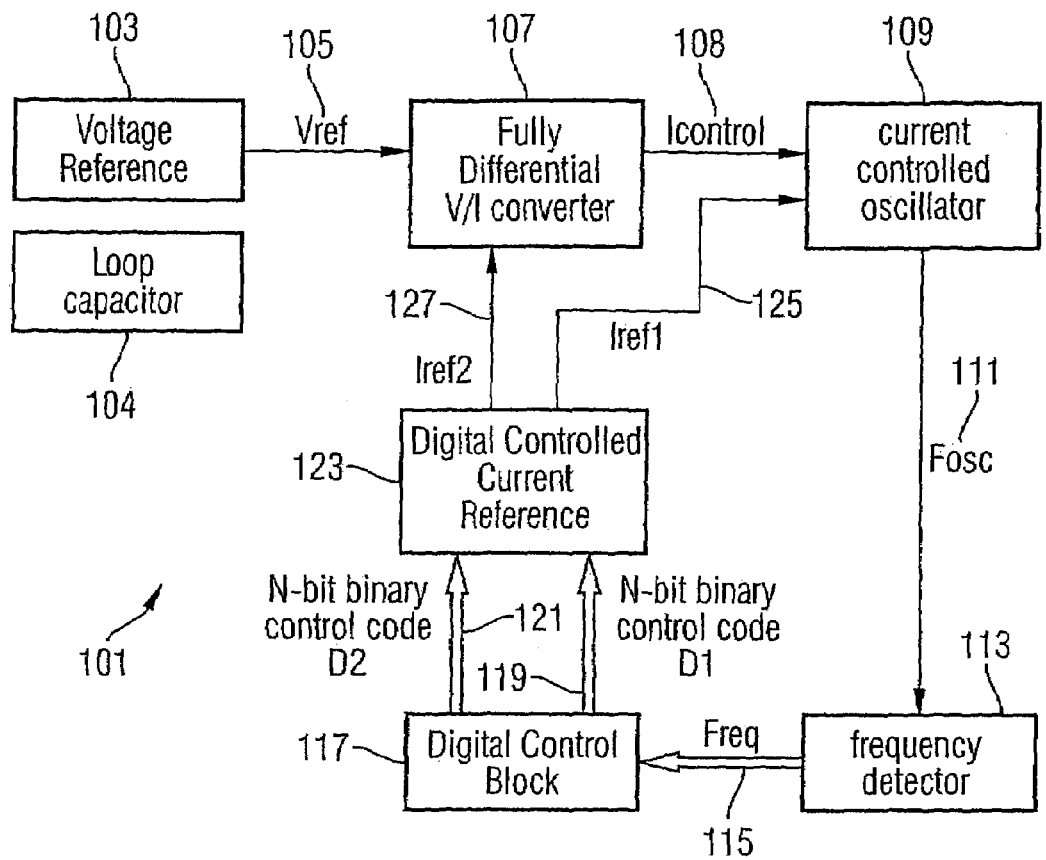
FIG. 1 shows a setup for the self-calibration of a tunable oscillator of the present invention.

FIG. 1 shows a setup for the self-calibration of a tunable oscillator 101 of the present invention. A pre-calibration is first performed. A fully differential voltage-to-current (V/I) converter 107 has an input for receiving a voltage from a phase-locked loop. During normal operation of the tunable oscillator, the voltage is supplied by a loop capacitor 104 in the phase locked loop (PLL). The change of voltage on the loop capacitor 104 is proportional to a phase or frequency difference between a frequency output from a current-controlled-oscillator 109 and from an external frequency source. The current-controlled-oscillator 109 is locked to the external frequency source by tuning the voltage on the capacitor according to the phase difference between the current-controlled-oscillator 109 divided by a frequency divider factor N (Fosc/N) and the external reference frequency.

During the pre-calibration, the output voltage from the loop capacitor 104 to the voltage-to-current converter 107 is replaced with a reference voltage Vref 105 from a voltage reference source 103. The voltage-to-current converter 107 converts the Vref 105 to a first current or control current 108. The control current 108 enters the current-controlled-oscillator 109 and is output as an output frequency Fosc 111. Thus, the output frequency Fosc 111 is responsive to the Vref 105.

The Fosc 111 is supplied to a frequency detector 113 which then outputs a signal representing the quantitative value of the frequency, Freq 115. The Freq 115 is fed to a-digital control block 117.

The digital control block 117 outputs N-bit binary control codes D1 119 and D2 121 to control a digitally controlled current reference 123. Preferably a PTAT current reference is used as the current reference 123 is in order to compensate for temperature variation of the CCO 109. The N-bit binary control codes D1 119 and D2 121 can be produced by digital circuits.

In response to the N-bit binary control code D1 119, the digitally controlled current reference 123 supplies a first reference current Iref1 (second current) 125. In response to the N-bit binary control code D2 121, the digitally controlled current reference 123 supplies a second reference current Iref2 (third current) 127. The Iref1 125 is input into the current-controlled-oscillator 109 to adjust the gain of the current-controlled oscillator 109. The Iref2 127 is input into the voltage-to-current converter 107 to adjust the control current 108 by adjusting the gain of the voltage-to-current converter 107. The Iref2 127 is the tail-current of the voltage-to-current converter 107, setting the maximum value of the control current 108 that can be supplied by the voltage-to-current converter 107.

Figure 2:
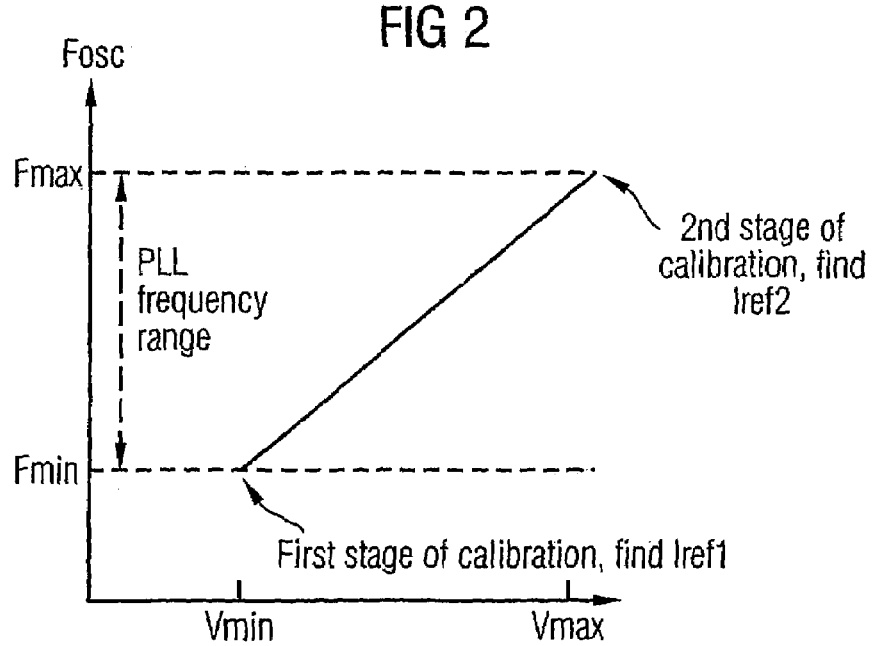
FIG. 2 is an exemplary illustration of the linear gain produced by the self-calibration method used by the tunable oscillator of FIG. 1.

The pre-calibration method can include two stages. FIG. 2 is an exemplary illustration of the linear gain produced by the two-stage self-calibration method. First, the voltage reference 103 is set to supply a reference voltage 105 having a value approximately equal to a lower design voltage tolerance of the capacitor 104 (Vmin in the figure). The Iref1 125 input into the current-controlled-oscillator 109 is adjusted so that at Vmin, the output frequency 109 is fixed at the lower frequency (Fmin in the figure) of the lock-in frequency range required by the phase-locked loop. Next, the voltage reference 103 is set to supply a reference voltage 105 having a value approximately equal to an upper design voltage tolerance of the capacitor 104 (Vmax in the figure).

The Iref2 127 input into the voltage-to-current converter 107 is adjusted so that at Vmax, the output frequency 109 is fixed at the upper frequency (Fmax in the figure) of the lock-in frequency range required by the phase-locked loop. The result is that the tunable oscillator 101 can output frequencies spanning the entire lock-in frequency range required by the phase-locked loop (PLL) while maintaining the voltage across the capacitor 104 within the designed tolerance range.

Figure 4:
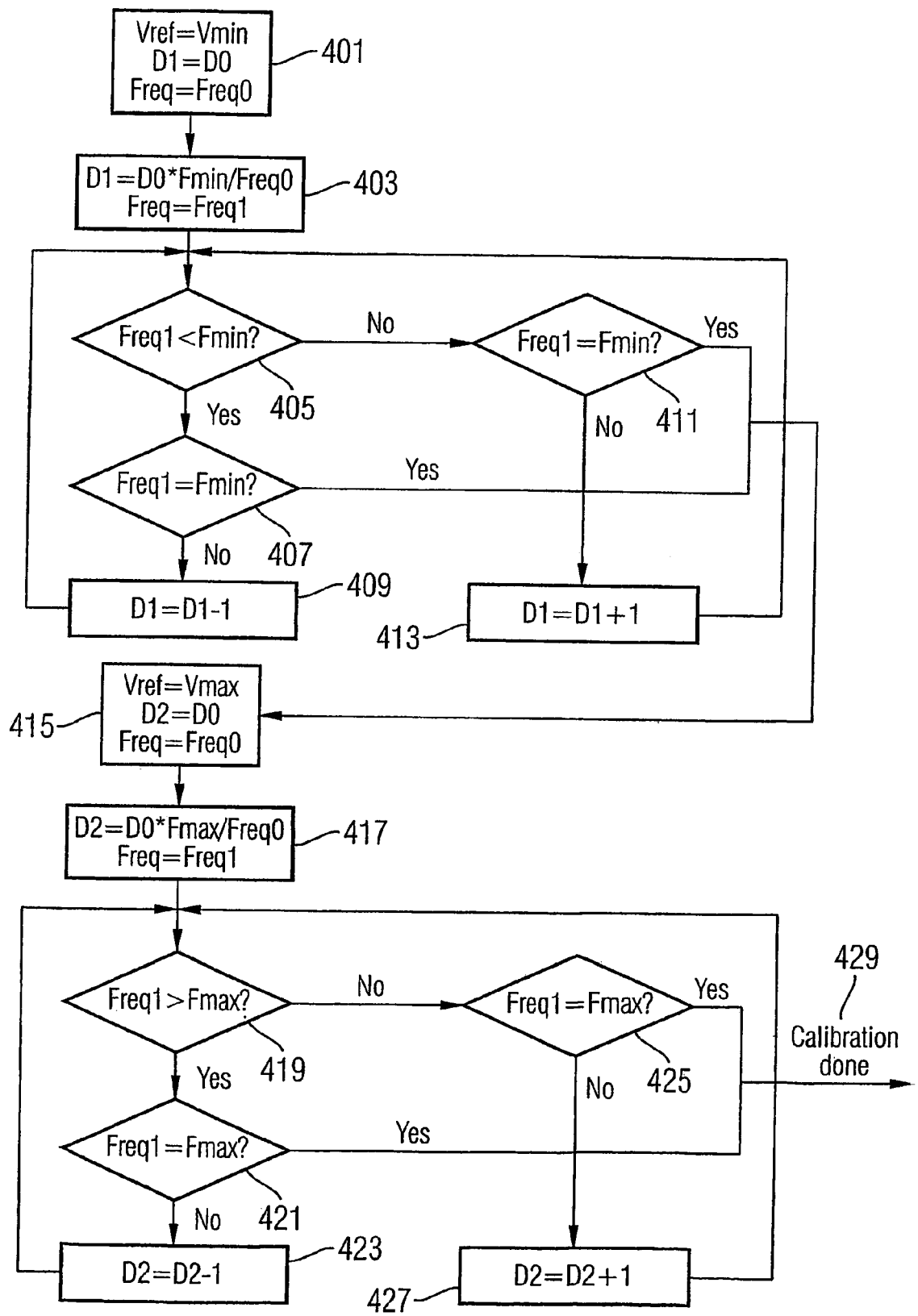
FIG. 4 is a flowchart representation of the calibration method.

FIG. 4 is a flowchart representation illustrating the two-stage calibration method in greater detail. In the first stage of the method, at a step 401 the voltage reference 103 is set to supply a reference voltage 105 having the value Vmin (approximately the minimum design value for the loop capacitor 104) as in FIG. 2. Also, the N-bit binary control code D1 is set to an initial default value of D0. D0 can be any value but is generally chosen as an intermediate value for the given circuit. This D0 will produce an initial current-controlled-oscillator frequency of Freq0. In order to make the calibration process faster, it is desirable to adjust D1 to a value that will adjust the initial frequency Freq0 to a frequency closer to the target value of Fmin as described above. Therefore, at a step 403, a linear approximation is performed on the initial value of D1, namely D0, using the initial frequency Freq0. The equation for this linear approximation is: $D1=D0*Fmin/Freq0$. This new linear approximation of D1 119 produces an initial default Iref1 125 value. This Iref1 125 value adjusts Fosc 111 to have a value Freq1 closer to Fmin than is the initial frequency of Freq0. The Iref2 127 is set to have a value of zero during the first stage. The frequency detector 113 then detects the frequency of Fosc 111 and determines the frequency value Freq 115 which is fed into the digital control block 117.

At steps 405, 407 and 411 the control block 117 compares the Freq 115 with the lower frequency (Fmin in the figure) of the lock-in frequency range required by the phase-locked loop. When the Freq 115 is lower than Fmin, the control code D1 119 is decremented by one at a step 409 to decrease Iref1 125. When the Freq 115 is above Fmin, the control code is incremented by one at step 413 to increase Iref1 125. D1 119 can be repeatedly incremented and/or decremented until the D1 119 is determined which results in an Iref1 125 which produces a Freq 115 approximately equal to Fmin. At this point, the value of the D1 119 is latched (at which point D1 is referred to as Doptimized1) and remains constant to produce the current Ioptimized1. Once this D1 119 is found, the method moves on to the second stage.

In the second stage of the method, at a step 415 the voltage reference 103 is set to supply a reference voltage 105 having the value Vmax (approximately the maximum design value for the loop capacitor 104) as in FIG. 2. Also, the N-bit binary control code D2 121 is set to a default value of D0. At a step 417, D2 121 is adjusted from its initial value of D0 to a value determined from the initial frequency Freq0 using the linear approximation equation: $D2=D0*Fmax/Freq0$. This D2 121 produces an Iref2 127 value. The current Iref1 127 is set during the first stage by latching the value of D1 119 at Doptimized1. This results in Fosc 111 having a value of Freq1. The frequency detector 113 then detects the frequency of Fosc 111 and determines the frequency value Freq 115 which is fed into the digital control block 117.

At steps 419, 421 and 425 the control block 117 compares the Freq 115 with the upper frequency (Fmax in the figure) of the lock-in frequency range required by the phase-locked loop. When the Freq 115 is higher than Fmax, the control code D2 121 is decremented by one at a step 423 to decrease Iref2 127. When the Freq 115 is below Fmax, the control code is incremented by one at step 427 to increase Iref2 127. D2 121 can be repeatedly incremented and/or decremented until a D2 121 is determined which results in an Iref2 127 which produces a Freq 115 approximately equal to Fmax. Once this D2 121 is found, the value of the D2 121 is latched (at which point D2 is referred to as Doptimized2), to produce the current Ioptimized2, and remain's constant.

Figure 3:
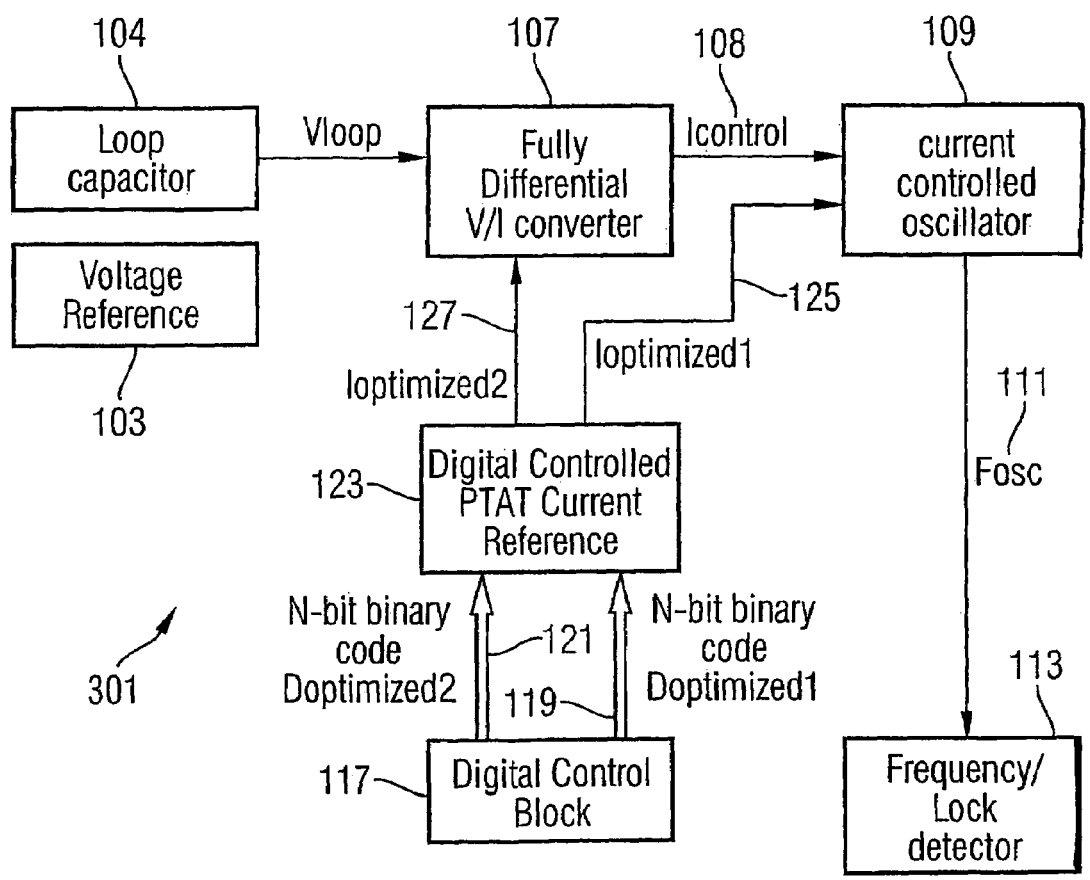
FIG. 3 shows the tunable oscillator, calibrated using the method of the present invention, during operation.

FIG. 3 shows the operational configuration 301 of the tunable oscillator 101 of FIG. 1 following calibration, using the method of the present invention. The loop capacitor 104 of the phase-locked-loop is connected to the voltage-to-current converter 107. The N-bit binary control codes 119, 121 are latched to Doptimized1 and Doptimized2, respectively. The constant current Ioptimized1 is fed into the CCO 109 and determines its minimum oscillation frequency. The bias current Ioptimized2 is fed into the voltage-to-current converter 107 to maximize the dynamic range of the loop capacitor 104, reduce the VCO sensitivity, and improve the jitter performance and loop stability to improve the process tolerance. The performance of the resulting tunable oscillator (VCO) having linear gain over the entire PLL frequency range from the minimum capacitor voltage to the maximum capacitor voltage is illustrated in FIG. 2.

In the illustrated embodiments, other combinations and modifications are possible. For example, rather than first determining Ioptimized1, Ioptimized2 can determined first and then Ioptimized1 can be determined. Thus, although the invention has been described above using particular embodiments, many variations are possible within the scope of the claims, as will be clear to a skilled reader.

I claim:

1. A tunable oscillator comprising:
    a voltage-to-current converter having an input for receiving a voltage from a phase-locked loop and an output for outputting a first current converted from the voltage;
    a current-controlled oscillator having an input for receiving the first current and an output for outputting an output frequency responsive to the voltage;
    a second current input into the current-controlled oscillator for adjusting the gain of the current-controlled oscillator;
    a third current input into the voltage-to-current converter for adjusting the first current and the gain of the voltage-to-current converter; and
    a control circuit for adjusting the second and third currents so that the output frequency spans a lock-in frequency range required by the phase-locked loop, wherein the control circuit uses a linear approximation to pre-set the second current to a value approaching a current value that will produce an output frequency equal to the lower frequency of the lock-in frequency range.

2. The tunable oscillator of claim 1, wherein the voltage from the phase-locked loop is supplied from a capacitor and the control circuit adjusts the second and third currents so that the output frequency spans the lock-in frequency range required by the phase-locked loop as the voltage from the capacitor varies over a voltage range within the design tolerance of the capacitor.

3. The tunable oscillator of claim 2, further comprising at least one voltage reference source used during a pre-calibration stage for:
    a) supplying to the tunable oscillator a first voltage having a value approximately equal to a lower design voltage tolerance of the capacitor whereupon the control circuit adjusts the second current so that the output frequency is approximately the lower frequency of the lock-in frequency range required by the phase-locked loop, and
    b) supplying to the tunable oscillator a second voltage having a value approximately equal to a upper design voltage tolerance of the capacitor whereupon the control circuit adjusts the third current so that the output frequency is approximately the upper frequency of the lock-in frequency range required by the phase-locked loop.

4. The tunable oscillator of claim 1, wherein the second and third currents are independently adjusted by the control circuit.

5. The tunable oscillator of claim 1, wherein the control circuit adjusts the second and third currents based on a comparison of the output frequency with minimum and maximum frequencies of the lock-in frequency range required by the phase-locked loop.

6. The tunable oscillator of claim 1, wherein the control circuit adjusts the second current based on a comparison of the output frequency with a minimum frequency of the lock-in frequency range required by the phase-locked loop.

7. The tunable oscillator of claim 1, wherein the control circuit adjusts the third current based on a comparison of the output frequency with a maximum frequency of the lock-in frequency range required by the phase-locked loop.

8. The tunable oscillator of claim 1, further comprising a capacitor for supplying a voltage to the voltage-to-current converter, the voltage proportional to the output frequency.

9. A method for calibrating a tunable oscillator comprising the steps of:
    supplying a first voltage to a voltage-to-current converter to produce a first control current from the voltage-to-current converter;
    supplying the first control current to a current-controlled-oscillator to produce a first frequency;
    comparing the first frequency to a lower frequency of the lock-in frequency range required by a phase-locked loop;
    adjusting a first calibration current input into the current-controlled-oscillator to adjust the first frequency to approximately the lower frequency;
    supplying a second voltage to the voltage-to-current converter to produce a second control current from the voltage-to-current converter;
    supplying the second control current to the current-controlled-oscillator to produce a second frequency;
    comparing the second frequency to an upper frequency of the lock-in frequency range required by a phase-locked loop; and
    adjusting a second calibration current input into the voltage-to-current converter to adjust the second frequency to approximately the upper frequency, further comprising the step of using a linear approximation to pre-set the first calibration current to a value approaching a first calibration current value that will produce an output frequency equal to the lower frequency.

10. The method of claim 9, wherein the first voltage has a value approximately equal to a lower design voltage tolerance of a capacitor of a phase-locked loop.

11. The method of claim 9, wherein the second voltage has a value approximately equal to an upper design voltage tolerance of a capacitor of a phase-locked loop.

12. The method of claim 9, wherein the first voltage has a value approximately equal to a lower design voltage tolerance of a capacitor of a phase-locked loop and the second voltage has a value approximately equal to an upper design voltage tolerance of a capacitor of a phase-locked loop.

13. The method of claim 12, further comprising the step of supplying a voltage from the capacitor of the phase-locked loop to a voltage-to-current converter, wherein the voltage is proportional to the output frequency of the current-controlled-oscillator.

14. The method of claim 9, further comprising the step of using a linear approximation to set the second calibration current to a value approaching a second calibration current value that will produce an output frequency equal to the upper frequency.

* * * * *